(12) United States Patent
Bailey et al.

(10) Patent No.: US 8,613,364 B2
(45) Date of Patent: Dec. 24, 2013

(54) MODULAR DATACENTER SERVER RACK RETENTION

(75) Inventors: Mark M. Bailey, Burnet, TX (US); Laurent A. Regimbal, Round Rock, TX (US)

(73) Assignee: Dell Products, LP, Round Rock, TX (US)

( * ) Notice: Subject to any disclaimer, the term of this patent is extended or adjusted under 35 U.S.C. 154(b) by 618 days.

(21) Appl. No.: 12/606,014

(22) Filed: Oct. 26, 2009

(65) Prior Publication Data

US 2011/0094978 A1 Apr. 28, 2011

(51) Int. Cl.
*A47F 7/00* (2006.01)
*A47G 29/00* (2006.01)

(52) U.S. Cl.
USPC .......................................... 211/26; 312/265.1

(58) Field of Classification Search
USPC ........ 211/26, 183; 312/265.1, 265.4, 352, 71; 174/135, 58, 59
See application file for complete search history.

(56) References Cited

U.S. PATENT DOCUMENTS

| | | | | |
|---|---|---|---|---|
| 1,902,239 A | * | 3/1933 | Holdgrafer | 312/71 |
| 2,434,996 A | * | 1/1948 | Gautier et al. | 118/42 |
| 3,482,895 A | * | 12/1969 | Becklin | 312/352 |
| 3,724,715 A | * | 4/1973 | Auriemma | 221/4 |
| 5,653,070 A | * | 8/1997 | Seguin | 52/167.1 |
| 5,957,556 A | * | 9/1999 | Singer et al. | 312/223.6 |
| 6,155,660 A | * | 12/2000 | Nicolai | 312/223.1 |
| 6,308,477 B1 | * | 10/2001 | Santamaria | 52/220.1 |
| 6,422,399 B1 | * | 7/2002 | Castillo et al. | 211/26 |
| 6,666,340 B2 | * | 12/2003 | Basinger et al. | 211/26 |
| 6,933,441 B2 | * | 8/2005 | Fuller et al. | 174/50 |
| 6,935,521 B2 | * | 8/2005 | Gundlach et al. | 211/183 |
| 7,086,707 B2 | * | 8/2006 | Wyatt et al. | 312/265.4 |
| 7,316,461 B2 | * | 1/2008 | Wyatt et al. | 312/352 |
| 7,480,154 B2 | * | 1/2009 | Lawrence et al. | 361/826 |
| 7,523,901 B2 | * | 4/2009 | Wu et al. | 248/225.21 |
| 7,718,889 B2 | * | 5/2010 | Rasmussen et al. | 174/50 |
| 7,857,145 B2 | * | 12/2010 | Mushan et al. | 211/26 |
| 8,116,076 B2 | * | 2/2012 | Cochrane | 361/679.34 |
| 2001/0036399 A1 | * | 11/2001 | Notohardjono et al. | 414/800 |
| 2002/0101721 A1 | | 8/2002 | Blood | |
| 2003/0019824 A1 | | 1/2003 | Gray | |
| 2004/0004418 A1 | * | 1/2004 | Wyatt et al. | 312/265.1 |
| 2004/0055984 A1 | * | 3/2004 | Gundlach et al. | 211/183 |
| 2004/0105655 A1 | * | 6/2004 | Ciulla | 386/46 |
| 2006/0267464 A1 | * | 11/2006 | Wyatt et al. | 312/265.4 |
| 2007/0039902 A1 | * | 2/2007 | Lawrence et al. | 211/26 |
| 2007/0119794 A1 | * | 5/2007 | Hidaka et al. | 211/26 |
| 2008/0012456 A1 | * | 1/2008 | Judge et al. | 312/334.1 |
| 2008/0123284 A1 | | 5/2008 | Jaramillo et al. | |

OTHER PUBLICATIONS

"Sun Modular Datacenter," Product Overview, http://www.sun.com/products/sunmd/s20/, Oct. 23, 2009.

* cited by examiner

*Primary Examiner* — Jonathan Liu
*Assistant Examiner* — Patrick Hawn
(74) *Attorney, Agent, or Firm* — Larson Newman, LLP

(57) ABSTRACT

A modular datacenter includes a server rack, a main beam, and an attachment member. The server rack is configured to hold a plurality of servers. The main beam is configured to hold the server rack in a specific location within the modular datacenter. The attachment member is coupled to the main beam and connected to the server rack. The attachment member is configured to apply a force to the server rack to put the server rack under compression or tension, and to change the natural frequency of the server rack based on the compression or the tension and on the location of the attachment member with respect to the server rack.

16 Claims, 4 Drawing Sheets

MODULAR DATACENTER SERVER RACK RETENTION

FIELD OF THE DISCLOSURE

This disclosure relates generally to information handling systems, and more particularly relates to modular datacenter server rack retention.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A modular datacenter can be a datacenter that is mobile, such that the modular datacenter can be transported to a specific location to provide additional computing capacity. The modular datacenter can include multiple server racks, servers, cooling devices, and other components. Additionally, the modular datacenter is typically transported with the server racks fully loaded with information technology equipment, such as the servers. Thus, when the modular datacenter arrives at the desired location, the modular datacenter can be quickly set up and made operational.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
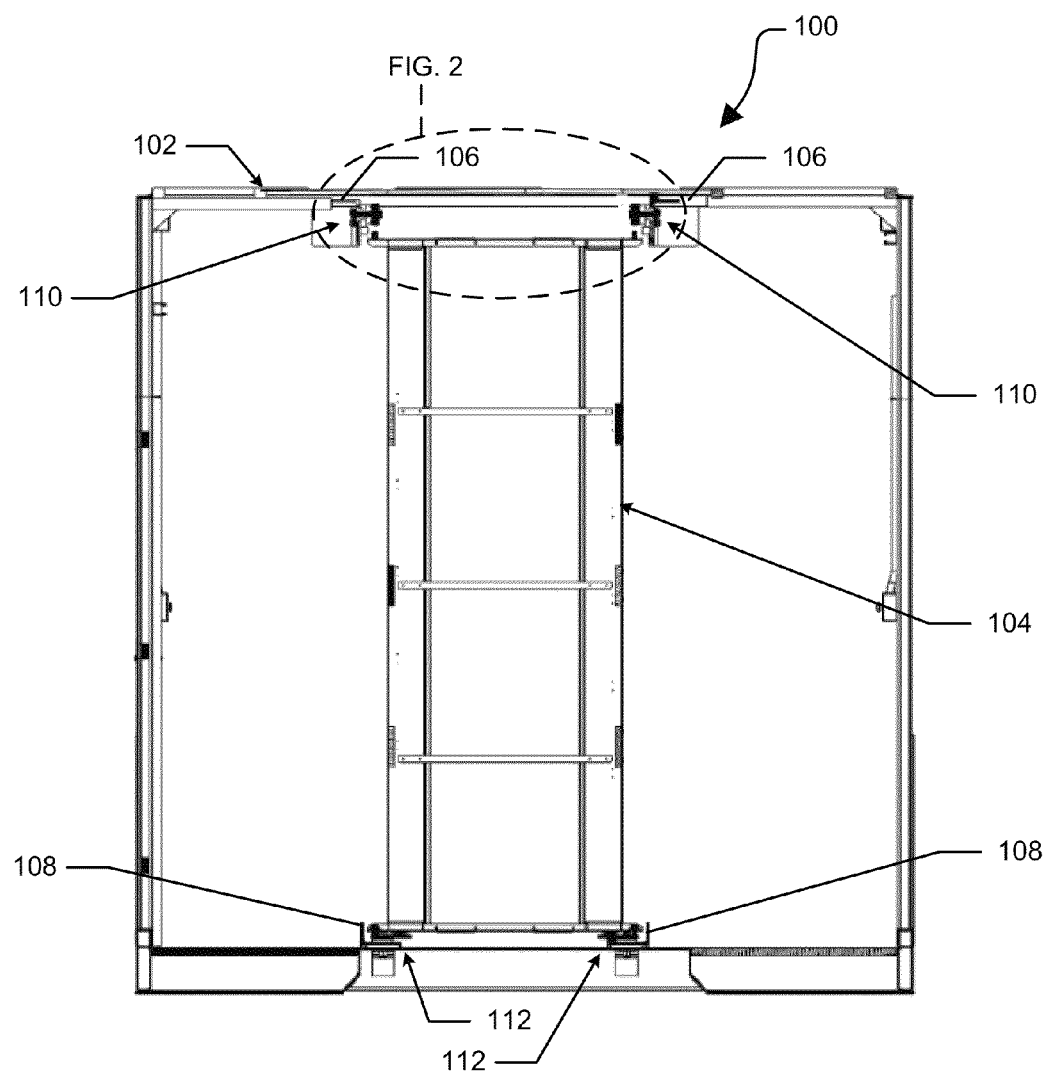
FIG. 1 is a schematic diagram of a modular datacenter.

FIG. 1 shows a modular datacenter 100 of an information handling system. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

The modular datacenter 100 includes a modular chassis 102, a server rack 104, main beams 106, base beams 108, top retention members 110, and bottom retention members 112. The main beams 106 are preferably connected to a top panel of the modular chassis 102, and the base beams 108 are preferably connected to a bottom panel of the modular chassis. The top retention members 110 are preferably connected to the main beams 106, and the bottom retention members 112 are preferably connected to the base beams 108. The server rack 104 is preferably connected to both the top retention members 110 and to the bottom retention members 112.

Figure 2:
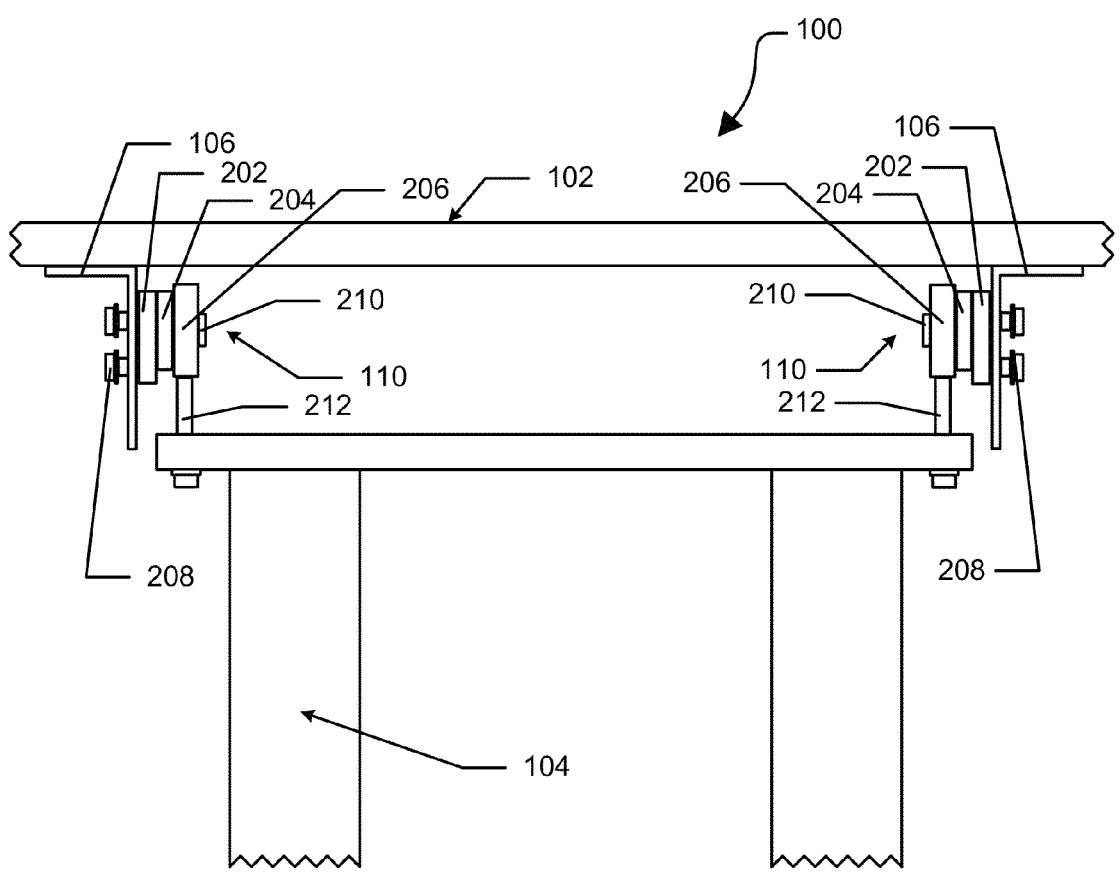
FIG. 2 is a schematic diagram of an enlarged view of a top portion of the modular datacenter including top retention members and a top portion of a server rack.
Figure 3:
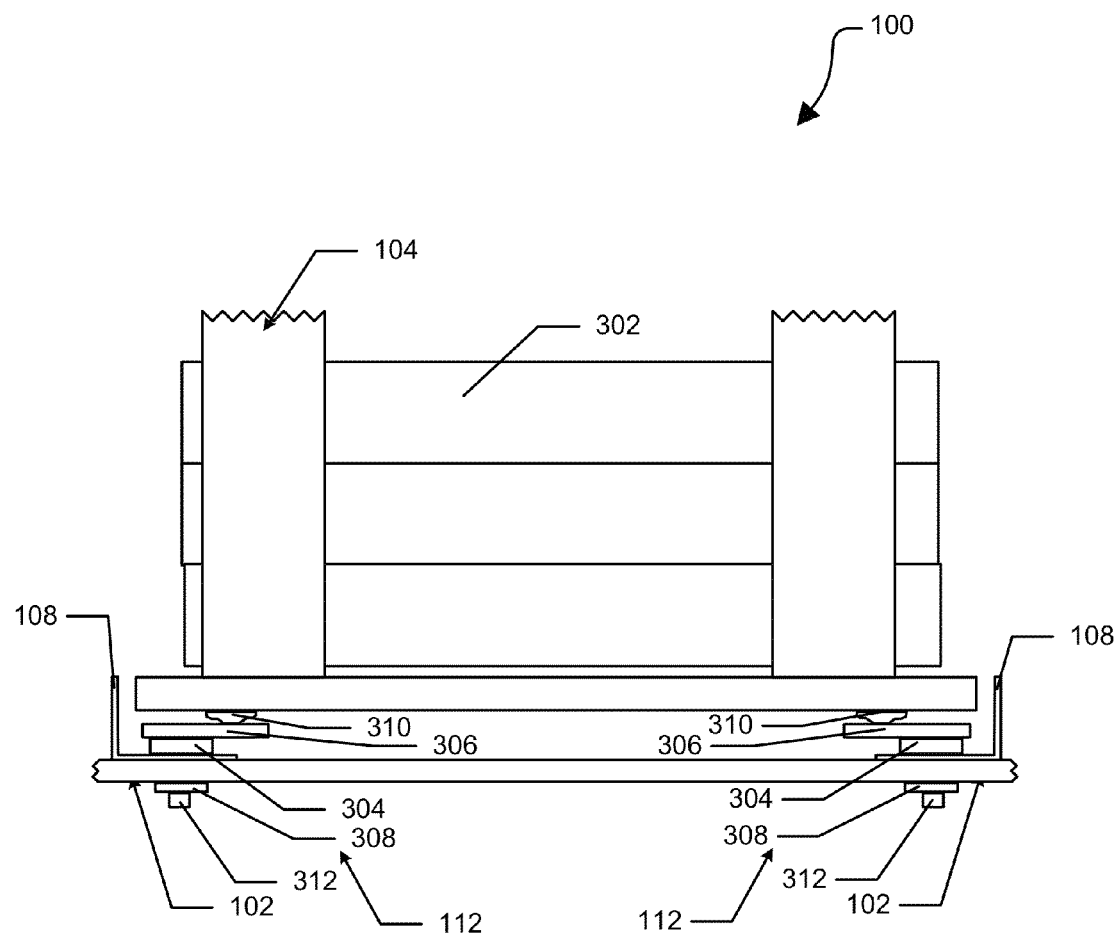
FIG. 3 is a schematic diagram of an enlarged view of a bottom portion of the modular datacenter including bottom retention members and a bottom portion of the server rack having multiple servers.

The server rack 104 can be preloaded with multiple servers, shown in FIG. 3, so that the modular chassis 102 can be transported to a remote location for immediate use. The top retention members 110 and the bottom retention members 112 respectively can connect the server rack 104 to the main beams 106 and to the base beams 108 of the modular chassis 102. Thus, during transportation of the modular datacenter 100, the main beams 106 and the base beams 108 can keep the server rack 102 from shifting around within the modular chassis 102. The top retention members 110 and the bottom retention members 112 can also isolate the server rack 104 from vibrations within the modular datacenter 100, and can support the server rack in the up and down, left and right, and forward and backward directions. The vibrations within the modular datacenter 100 can be caused during the transportation of the modular datacenter, and/or can be caused by the operation of other devices within the modular chassis 102. The top retention members 110 can be adjusted on the main beams 106 to hold the server rack 104 within the modular chassis 102 under compression, tension, or neither compression nor tension as discussed more fully with respect to FIGS. 2 and 3.

FIG. 2 shows an enlarged view of a top portion of the modular datacenter 100. The top retention members 110 each have a slide member 202, an isolation mount 204, and an attachment member 206. The slide member 202 is connected to the main beam 106 with bolts 208. The slide member 202, the isolation mount 204, and the attachment member 206 are held in physical communication with each other with a bolt 210. The attachment members 206 are connected to the server rack 104 by bolts 212. The isolation mount 204 can be a center bonded isolation mount, such that the center of the isolation mount is metal to provide support for the bolt 210 to connect the slide member 202, the isolation mount, and the attachment member 206. The outer edges of the isolation mount 204 can be an elastomer such as rubber, such that the physical communication between the attachment member 210 and the isolation mount is through the rubber.

In an embodiment, the slide member 202 and the main beam 106 can be rigid so that the top retention member 110 can be held within a specific location of the modular chassis 102. The isolation mount 204 preferably isolates the attachment member 206 from the slide member 202 and from the main beam 106. Thus, the isolation mount 204 can reduce the amount of vibrations passed to the attachment member 206 from the base beam 106 and from the slide member 202. The slide member 202 can be adjusted on the main beam 106, such that the top retention member 110 can be in an uppermost position as shown in FIG. 2, a lowermost position, or any location between the uppermost and lowermost positions. The top retention members 110 can be placed in the uppermost position, so that the server rack 104 can be inserted in the modular chassis 102 between the top retention members and the bottom retention members 112. The slide member 202 can then be slid downwardly along the main beam 106 until the attachment member 206 is placed at a desired location with respect to the server rack 104. Then the attachment member 206 can be connected to the server rack 104 with the bolt 212.

In an embodiment, the top retention member 110 can be pressed downward with enough force that the server rack 104 is placed in compression by the force exerted from the attachment member 206 to the top of the server rack. In another embodiment, the top retention member 110 can be placed a desired height above the top of the server rack 104. Thus, as the bolt 212 connects the server rack 104 with the attachment member 206, the bolt can exert a force upward on the server rack to place the server rack in tension. Alternatively, the top retention member 110 can be placed in physical communication with the top of the server rack 104 without exerting a substantial force on the server rack, such that the bolt 212 can connect the server rack to the top retention member without placing the server rack under tension or compression. When the attachment member 206 and the top retention member 110 are in a desired location along the main beam 106, the bolts 208 can be tightened to hold the top retention member in the desired location and as a result the server rack 104 can be held in either compression, tension, or neither compression nor tension.

The compression and/or tension of the server rack 104 can change the natural frequency of the server rack, which can provide additional protection to the servers within the server rack from vibrations caused by other devices within the modular datacenter 100, and/or the transportation of the modular datacenter. The change in the natural frequency of the server rack 104 can cause the natural frequency of the server rack to be different than the frequency of the vibrations. Thus, the change in the natural frequency of the server rack 104 can prevent the vibrations within the modular chassis 102 from resonating within the server rack 104. In an embodiment, the top retention members 110 can be rotated ninety degrees, such that the top retention members align with and operate similar to the bottom retention members 112 as discussed below with respect to FIG. 3.

FIG. 3 shows an enlarged view of a bottom portion of the modular datacenter 100 with a plurality of servers 302 placed within the server rack 104. The bottom retention members 112 each have an isolation mount 304, an attachment member 306, a spacer 308, and a compression member 310. The isolation mount 304, the attachment member 306, and the spacer 308 are connected to the base beam 108 with a bolt 312. The bottom of the server rack 104 is in physical communication with the compression member 310, and connected to the attachment member 306 with a bolt and/or a screw.

When the server rack 104 is placed within the modular chassis 102, the server rack can be placed on the compression members 310 of the bottom retention members 112. The weight of the server rack 104 and the servers 302 is preferably supported by the bottom retention members 112, and the compression members 310 preferably provide a first isolation barrier between the bottom of the server rack and vibrations from the modular chassis 102. The attachment member 306 is preferably composed of a rigid material capable of supporting the weight of the server rack 104 and the servers 302.

The isolation mount 304 is preferably a center bonded isolation mount similar to the isolation mount 204 discuss above. Thus, the isolation mount 304 can provide isolation between the attachment member 306 and vibrations within the base beam 108. If the top retention member 110 is placed in a position along the main beam 106 such that the server rack 104 is placed in tension, the server rack can be lifted slightly and the compression of the compression members 310 can be decreased. In this situation, the bottom retention members 112 do not have to support the entire weight of the server rack 104.

Figure 4:
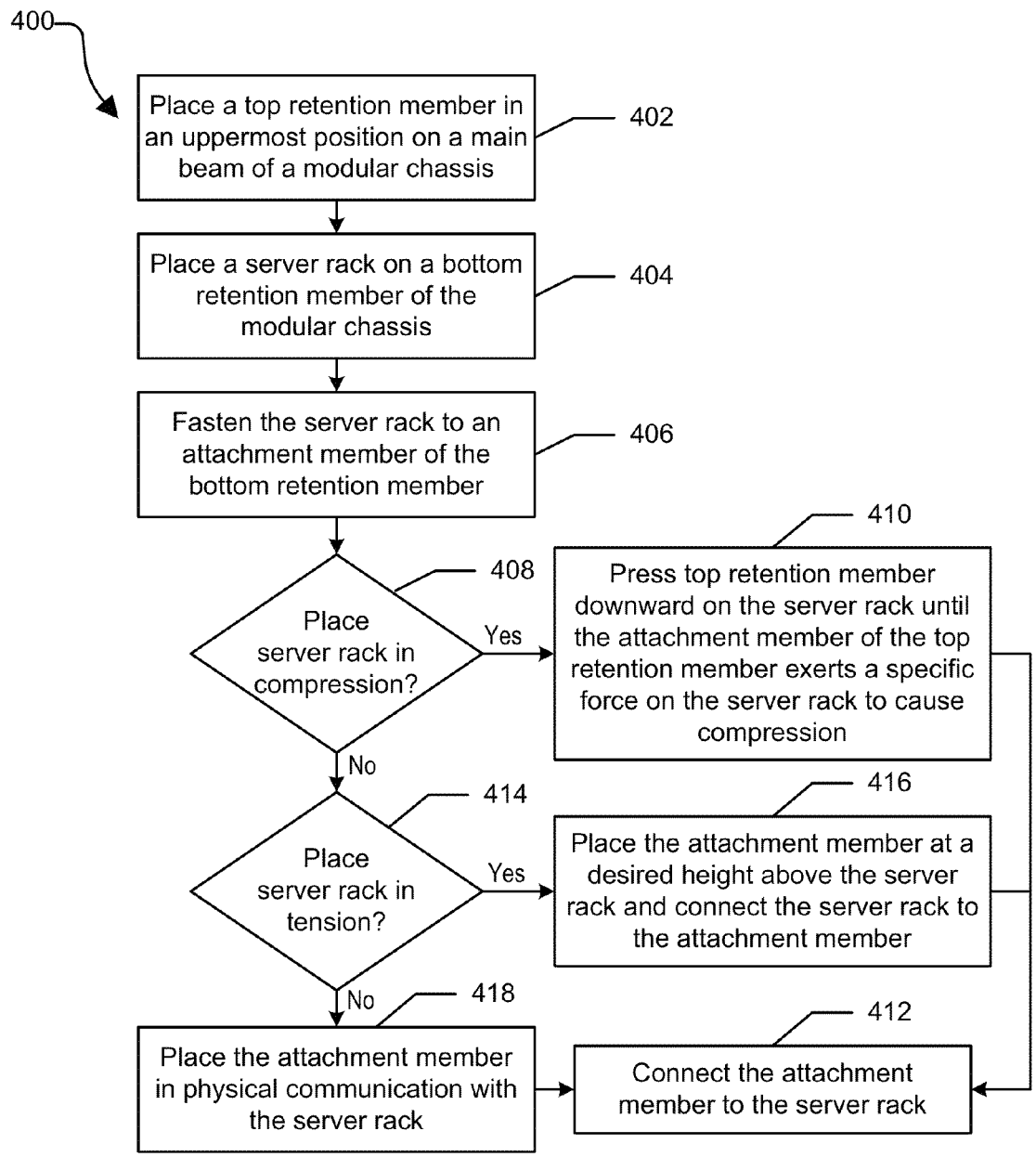
FIG. 4 is a flow diagram of a method for connecting the server rack within a modular chassis of the modular datacenter.

FIG. 4 shows a flow diagram of a method 400 for installing a server rack into a modular chassis of a modular datacenter. At block 402, a top retention member is placed in an uppermost position on a main beam of the modular chassis. The server rack is placed on a bottom retention member of the modular chassis at block 404. The server rack is preferably placed on a compression member of the bottom retention member. At block 406, the server rack is fastened to an attachment member of the bottom retention member. The attachment member is preferably isolated from a base beam of the modular chassis via an isolation mount. The isolation mount can reduce or prevent vibrations within the modular chassis from being transmitted to the server rack and the servers. The vibrations can be caused by the transportation of the modular datacenter and/or caused by the operation of other devices within the modular chassis.

At block 408, a determination is made whether the server rack is to be placed in compression. If the server rack is to be placed in compression, the top retention member is pressed downward until the attachment member of the top retention member exerts a force on the server rack to cause compression of the server rack at block 410. The attachment member of the top retention member and the server rack are preferably isolated from vibrations within a main beam of the modular chassis via an isolation mount. The server rack is connected to the attachment member at block 412. If the server rack is not to be placed in compression, a determination is made whether the server rack is to be placed is tension at block 414.

At block 416, if the server rack is to be placed in tension the attachment member is placed at a desired height above the server rack, the server rack is connected to the attachment member, and the server rack is held in tension. The server rack is connected to the attachment member at block 412. If the server rack is not to be placed in tension, the attachment member is placed in physical communication with the server rack without exerting enough force on the server rack to place the server rack in compression at block 418. The server rack is connected to the attachment member at block 412.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A modular datacenter comprising:
a server rack configured to hold a plurality of servers;
a main beam configured to hold the server rack in a specific location within the modular datacenter; and
a first attachment member coupled to the main beam and connected to the server rack, the first attachment member configured to apply a force to the server rack to put the server rack under compression or tension, and to change the natural frequency of the server rack based on the compression or the tension and on the location of the first attachment member with respect to the server rack;
a slide member in physical communication with the main beam and coupled to the first attachment member, the slide member configured to slide vertically along the main beam to change the distance between the first attachment member and the server rack;
a first isolation mount in physical communication with the first attachment member and coupled to the main beam, the first isolation mount configured to set a distance that the first attachment member is from the main beam, and further configured to isolate the server rack from vibrations produced by other components within the modular datacenter;
a second attachment member coupled to a bottom of the modular datacenter, the second attachment member configured to support a weight of the server rack;
a compression member in physical communication with the second attachment member and the server rack, the compression member configured to isolate the server rack from vibrations within the modular datacenter, wherein a compression of the compression member is affected by whether the first attachment member places the server rack under compression or tension; and
a second isolation mount in physical communication with a base beam and with the second attachment member, the second isolation mount configured to set a distance that the second attachment member is from the beam, and further configured to isolate the server rack from vibrations within the modular datacenter.

2. The modular datacenter of claim 1 wherein a distance between the first attachment member and the server rack affects the natural frequency of the server rack.

3. The modular datacenter of claim 2 wherein the server rack is under the tension when the distance between the first attachment member and the server rack is greater than a threshold distance.

4. The modular datacenter of claim 3 wherein the server rack is under the compression when the distance between the first attachment member and the server rack is less than the threshold distance, and the first attachment member exerts a specific amount of force downward on the server rack.

5. The modular datacenter of claim 1 wherein the first attachment member is connected to the server rack with a bolt, a screw, or any combination thereof.

6. A modular datacenter comprising:
a main beam connected to atop of the modular datacenter, the main beam configured to hold a server rack in a specific location within the modular datacenter;
a first attachment member coupled to the main beam, the attachment member configured to connect with the server rack, and further configured to apply a force to the server rack to put the server rack under compression or tension, and to change the natural frequency of the server rack based on the compression or the tension and on the location of the first attachment member with respect to the server rack;
a first isolation mount in physical communication with the first attachment member and coupled to the main beam, the first isolation mount configured to set a distance that the first attachment member is from the main beam, and further configured to further isolate the server rack from vibrations produced by other components within the modular datacenter;
a bottom beam connected to a bottom of the modular datacenter;
a second attachment member coupled to the bottom beam, the second attachment member configured to support a weight of the server rack;
a compression member in physical communication with the second attachment member and the server rack, the compression member configured to isolate the server rack from vibrations within the modular datacenter, wherein a compression of the compression member is affected by whether the first attachment member places the server rack is under compression or tension; and
a second isolation mount in physical communication with a base beam and with the second attachment member, the second isolation mount configured to set a distance that the second attachment member is from the base beam, and further configured to isolate the server rack from vibrations within the modular datacenter.

7. The modular datacenter of claim 6 further comprising:
a slide member in physical communication with the main beam and coupled to the first attachment member, the slide member configured to slide vertically along the main beam to change the distance between the first attachment member and the server rack.

8. The modular datacenter of claim 6 wherein a distance between the first attachment member and the server rack affects the natural frequency of the server rack.

9. The modular datacenter of claim 8 wherein the server rack is under the tension when the distance between the first attachment member and the server rack is greater than a threshold distance.

10. The modular datacenter of claim 9 wherein the server rack is under the compression when the distance between the first attachment member and the server rack is less than the threshold distance, and the first attachment member exerts a specific amount of force downward on the server rack.

11. The modular datacenter of claim 6 wherein the first attachment member is connected to the server rack with a bolt, a screw, or any combination thereof.

12. A modular datacenter comprising:

a server rack configured to hold a plurality of servers;

a main beam connected to a top panel of the modular datacenter, the main beam configured to hold the server rack in a specific location within the modular datacenter;

a base beam connected to a bottom panel of the modular datacenter;

a first retention member connected to the main beam, the first retention member including:

a first attachment member connected to the server rack, the first attachment member configured to apply a force to the server rack to put the server rack under compression or tension, and to change the natural frequency of the server rack based on the compression or the tension and on the location of the first attachment member with respect to the server rack;

a slide member in physical communication with the main beam, the slide member configured to slide vertically along the main beam to change the distance between the first attachment member and the server rack; and a first isolation mount in physical communication with the slide member and with the first attachment member, the first isolation mount configured to set a distance between the first attachment member and the main beam, and further configured to isolate the server rack from vibrations within the modular datacenter; and a second retention member connected to the base beam, the second retention member including:

a second attachment member configured to support a weight of the server rack;

a compression member in physical communication with the second attachment member and the server rack, the compression member configured to isolate the server rack from vibrations within the modular datacenter, wherein a compression of the compression member is affected by whether the first attachment member places the server rack under compression or tension; and a second isolation mount in physical communication with the base beam and with the second attachment member, the second isolation mount configured to set a distance between the second attachment member and the base beam, and further configured to further isolate the server rack from the vibrations within the modular datacenter.

13. The modular datacenter of claim 12 wherein a distance between the first attachment member and the server rack affects the natural frequency of the server rack.

14. The modular datacenter of claim 13 wherein the server rack is under the tension when the distance between the first attachment member and the server rack is greater than a threshold distance.

15. The modular datacenter of claim 14 wherein the server rack is under the compression when the distance between the first attachment member and the server rack is less than the threshold distance, and the first attachment member exerts a specific amount of force downward on the server rack.

16. The modular datacenter of claim 12 wherein the first attachment member is connected to the server rack with a bolt, a screw, or any combination thereof.

* * * * *